(12) United States Patent
Lazar et al.

(10) Patent No.: US 6,643,216 B1
(45) Date of Patent: Nov. 4, 2003

(54) ASYNCHRONOUS QUEUING CIRCUIT FOR DRAM EXTERNAL RAS ACCESSES

(75) Inventors: Paul S. Lazar, Santa Clara, CA (US); Seung Cheol Oh, San Jose, CA (US)

(73) Assignee: Nanoamp Solutions, Inc, San Jose, CA (US)

( * ) Notice: Subject to any disclaimer, the term of this patent is extended or adjusted under 35 U.S.C. 154(b) by 0 days.

(21) Appl. No.: 10/211,952

(22) Filed: Aug. 2, 2002

(51) Int. Cl.[7] .................................................. G11C 8/00
(52) U.S. Cl. ...................... 365/233; 365/233.5; 711/167
(58) Field of Search .............................. 365/233, 233.5, 365/191, 193; 711/167

(56) References Cited

U.S. PATENT DOCUMENTS 6,134,638 A * 10/2000 Olarig et al. ............... 711/167
6,209,071 B1 * 3/2001 Barth et al. ................. 711/167

* cited by examiner

Primary Examiner—Son Mai
(74) Attorney, Agent, or Firm—Patrick T. King (57) ABSTRACT

A method and queuing circuit are provided for storing asynchronous external RAS access requests and for executing corresponding RAS cycles. When no current external access RAS cycle is currently underway a first request latch or similar storage element is set in response to an initial access request. When access to the memory begins in a RAS cycle, this first request latch is reset. When a RAS cycle is currently underway, a second request-queuing latch is set in response to a new, second access request that occurs. Whenever a RAS cycle is completed, if the second queuing latch is set, a new RAS cycle is initiated and both the first and the second latches are reset. Any subsequent new access request may then be queued if the subsequent new access request arrives prior to completion of the current second access cycle.

9 Claims, 6 Drawing Sheets

ASYNCHRONOUS QUEUING CIRCUIT FOR DRAM EXTERNAL RAS ACCESSES

BACKGROUND OF THE INVENTION

1. Field of the Invention

This invention relates to dynamic random access memories (DRAMs) with an SRAM-type interface and, more particularly, to a technique for queuing a new DRAM external access request to the DRAM while a current access cycle is still in progress.

2. Prior Art

Previously, external accesses to an ordinary DRAM have been constrained to follow a conventions that requires that a new external access cannot be initiated until a current external access cycle is completed. However, with the advent of DRAM devices with an SRAM-type interface, these DRAMS must be able to respond to any asynchronous access request inputs that may occur during an external access RAS cycle. To preserve the integrity of whatever data is being transferred during an external access cycle, a DRAM device with an SRAM-type interface must complete a current RAS cycle prior to beginning execution of a new external access cycle.

Consequently, a need exists for a DRAM device with an SRAM-type interface that allows external access operations to be initiated while a current external access cycle is still in progress.

SUMMARY OF THE INVENTION

The present invention provides a more general interface protocol for a DRAM device that has a SRAM-type interface. External row-access-select (RAS) requests to a DRAM device that has a SRAM-type interface are provided for initiating a RAS cycle in which external data is written into the DRAM or in which data in the DRAM is read out to an external location. The present invention provides queuing of external access requests and allows new external RAS access cycles to the DRAM to be initiated prior completion of a current external access cycles.

The present invention provides a queuing circuit that queues a request for a new external access and that subsequently executes a corresponding RAS cycle for that new request after completion of a current external access cycle.

An external access request precedes execution of a RAS cycle. The external access request initiates a RAS cycle. When no current external access RAS cycle is currently underway, that is, when no RAS request is currently being processed, the present invention provides that a first request latch or similar storage element is set in response to an initial access request. When access to the memory begins in a RAS cycle, this first request latch is reset.

In the case where a first RAS cycle is currently being processed, a second in-progress latch or similar storage element is set in response to a new, second access request that occurs. When the first RAS cycle is completed, if the second in-process latch is set, a new RAS cycle is initiated for the second access request and both the first and the second latches are reset. Any subsequent new external access requests are queued if the subsequent new access request arrives prior to completion of a current second access cycle.

The present invention provides for a more general asynchronous interface for a DRAM device. Without the invention, external accesses are constrained to follow the DRAM convention that requires that a new access cannot be started until the current access cycle is completed. With the invention, accesses can be initiated sooner and they are queued by the circuits of the present invention.

The present invention provides an method and a circuit for queuing asynchronous external memory requests that initiate external RAS cycles of a DRAM. The external-access request queuing circuit includes an address transition circuit that responds to changes in address input signals for the DRAM by providing an address change detection signal (det_a_buf) and, if an address input signal is stable, provides a stable address signal (addr_stable). A RAS timer circuit receives an input selection trigger signal (sel_xras) to provide a RAS output signal (xras_time1_b or xras1_b) that controls execution of external RAS cycles by the DRAM.

The invention provides a pair of latches. When there is no RAS cycle currently underway, a first latch is set in response to a stable address signal (addr_stable) to thereby provide an output signal (xr_rq) that initiates an input selection trigger signal (sel_xras)for the RAS timer circuit. The first latch is reset whenever execution of an external RAS cycle begins.

While a current RAS access cycle is underway, a second queuing latch is set in response to an address change detection signal (det_a_buf). The second latch provides a request-queue output signal (xque) that is used when the RAS output signal goes inactive to alternatively help initiation of the input selection trigger signal (sel_xras) for the RAS timer circuit.

If the second queuing latch is set and when any RAS access cycle is complete, a new RAS cycle is initiated and the second queuing latch is reset. The invention provides that any new access requests, as indicated by the address change detection signal (det_a_buf), that are received when a current RAS access cycle is underway are queued in the second queuing latch to await execution of a corresponding RAS cycle.

The second latch has associated with it a queuing logic gate that provides an active xque_start_b for initiating the input selection trigger signal (sel_xras) for the RAS timer circuit signal upon receipt of an active xque signal, an inactive addr_stable signal, and an inactive xras1_b signal. The active xque_start_b signal also resets the second queuing latch.

In one embodiment of the invention, the first latch is an RS flip-flop circuit having an active output signal xr_rq that is set by the addr_stable signal going inactive when the xras_time1_b signal is inactive and that is reset when the xras_time1_b begins to be active.

In this embodiment of the invention, the second queuing latch is a D flip-flop circuit with an output signal xque. The D flip-flop has a D input terminal for receiving the xras_1 signal a clock terminal for receiving an output signal from a 2-input AND gate that receives a det_a_buf signal from the address transition detection circuit and that receives an inverted xque signal.

A queuing logic gate provides an active xque_start_b output signal upon receipt of an active xque signal, an inactive addr_stable signal, and an inactive xras1_b signal. The active xque_Start_b signal also resets the D flip-flop.

The RAS output signal from the RAS timer circuit has a predetermined active time for controlling execution of an external RAS cycle by the DRAM. A collection NAND gate receives the active xque start_b signal or the active output signal xr_rq to provide an active sel_xras signal from the RAS timer circuit.

A method is provided for queuing asynchronous external memory requests for external RAS cycles of a DRAM having an SRAM-type interface. In response to any changes in address signals for the DRAM, the methods provides for generating a det_a_buf signal and generating an address stable signal addr_stable if the new address is stable. If there is no RAS cycle currently underway, then the addr_stable signal is used to latch a first RAS request signal in a first latch. In response to the latched first RAS request signal, a first RAS cycle is initiated. The first latch is reset when the first RAS cycle begins. If the first RAS cycle is currently underway, a subsequent, second RAS cycle request signal is latched into a second latch using the det_a_buf signal.

When the first RAS cycle is complete and, if the second latch contains a second RAS cycle request signal, a second RAS cycle is initiated for the second RAS cycle request and the second latch is reset when the second RAS cycle begins and the addr_stable signal is used to latch the first RAS request signal in the first latch.

BRIEF DESCRIPTION OF THE DRAWINGS

The accompanying drawings, which are incorporated in and form a part of this specification, illustrate an embodiment of the invention and, together with the description, serve to explain the principles of the invention:

FIG. 3 consisting of FIGS. 3A and 3B is a circuit diagram of an asynchronous RAS request queuing circuit according to the present invention.

DETAILED DESCRIPTION OF THE PREFERRED EMBODIMENTS

Reference is now made in detail to preferred embodiments of the invention, examples of which are illustrated in the accompanying drawings. While the invention is described in conjunction with the preferred embodiments, it will be understood that they not intended to limit the invention to these embodiments. On the contrary, the invention is intended to cover alternatives, modifications and equivalents, which may be included within the spirit and scope of the invention as defined by the appended claims. This application hereby incorporates by reference the subject matter of co-pending, commonly-owned U.S. Patent Application entitled "DRAM with Total Self-Refresh and Control Circuit", Ser. No. 10/174867, filed Jun. 18, 2002.

Figure 1:
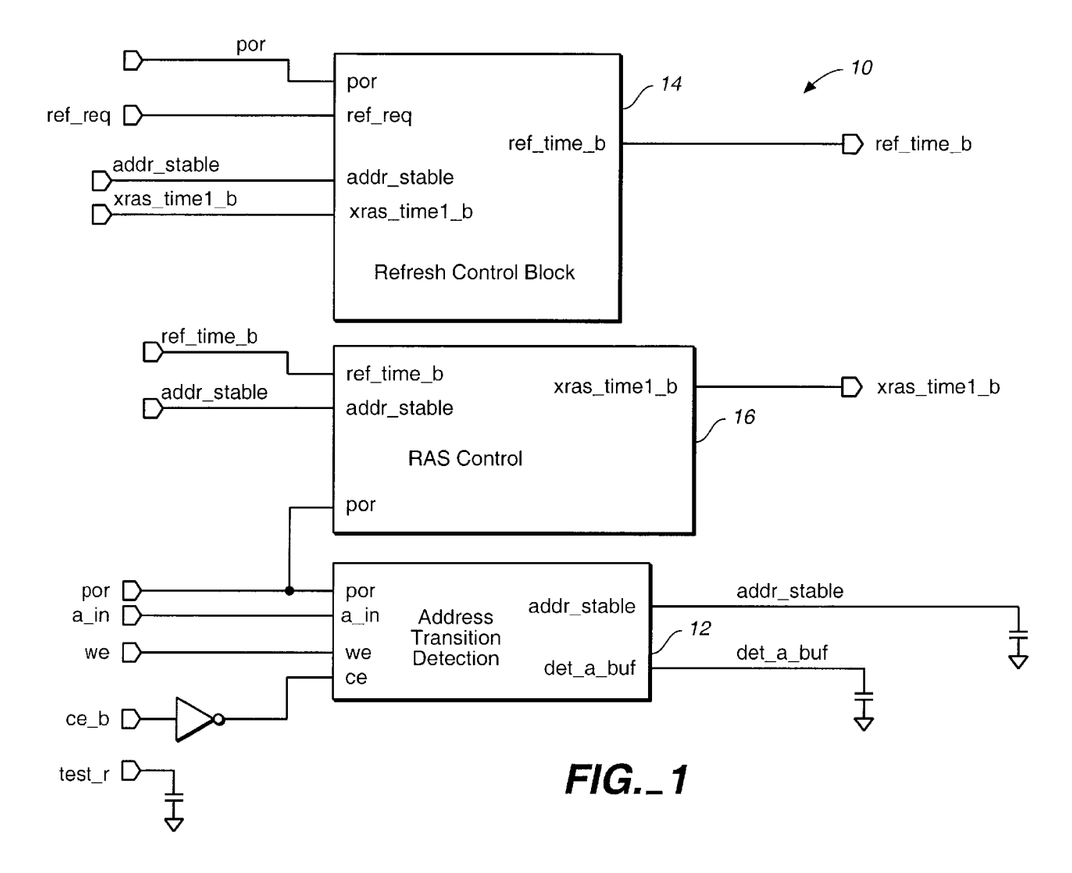
FIG. 1 illustrates an arbitration and control subsystem 10 having an address transition detection block, a internal refresh control block, and an external RAS control block.

FIG. 1 illustrates an arbitration and control subsystem 10 for a DRAM with an SRAM interface. The control subsystem includes an address transition detection block 12. The arbitration and control subsystem 10 also includes an internal refresh control block 14 and a RAS control block 16. The address transition detection block 12 has input terminals for receiving a power-on reset (por) signal, a write-enable (we) signal, a chip-enable (ce) signal, and an address-input (a_in) signal. An external access request occurs whenever the address-input a_in signal changes state (either from LOW to HIGH or from HIGH to LOW) and whenever the we signal or the ce signal changes state from an unasserted (LOW) state to an asserted (HIGH) state. When an external access occurs, the address transition detection block 12 generates an output signal called an address-stable (addr_stable) output signal and an address change detection det_a_buf output signal. Note that typically the a_in signal does not change state unless ce is asserted. The address detection det_a_buf signal is a short-duration active-HIGH, positive pulse indicating that an address transition has taken place. The addr_stable signal is a longer, active-LOW negative pulse indicating that an address transition has occurred and that the address is stable. If another address transition occurs while the addr_stable signal is being asserted, the duration of the addr_stable pulse signal is extended.

Figure 2:
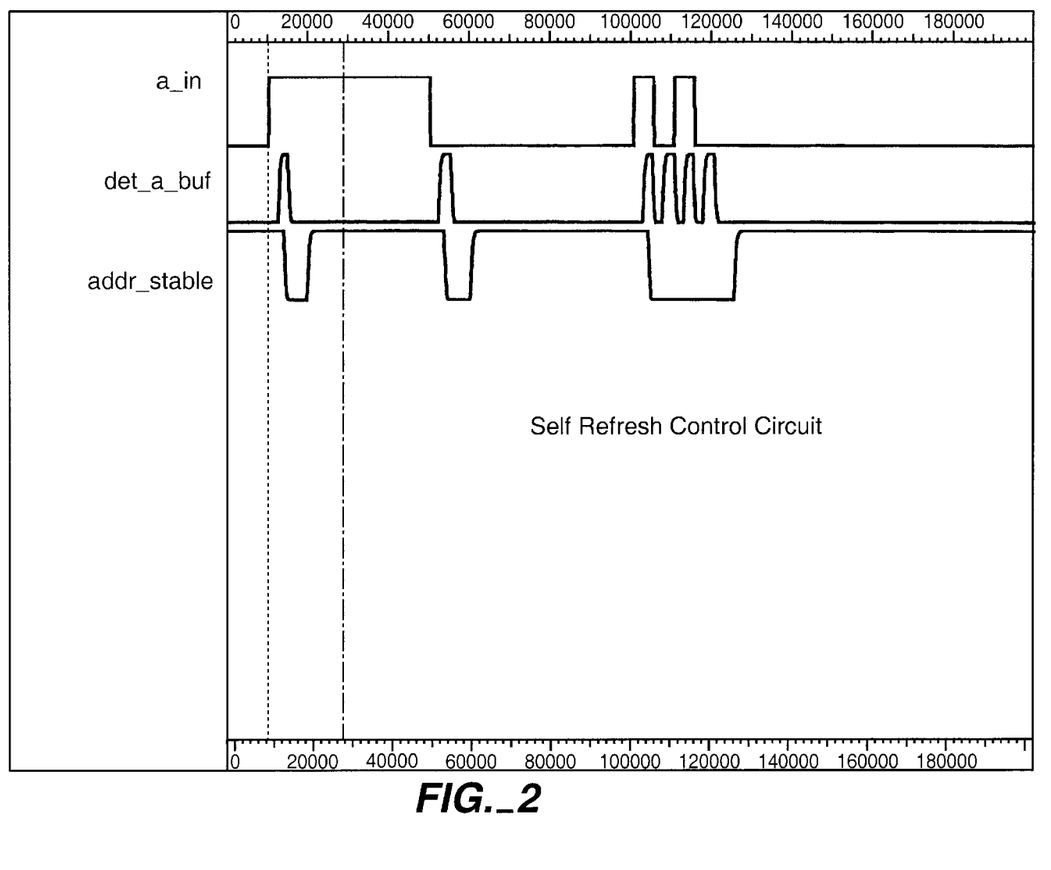
FIG. 2 is a timing diagram illustrating the det_a_buf address detection signal and addr_stable pulse signals for various frequency of changes in an input address signal.

FIG. 2 is a timing diagram illustrating the address detection det_a_buf and addr_stable pulse signals for various frequency of changes in the a in signal. The timing diagram shows positive pulses for det_a_buf signals and negative pulses for addr_stable signals. For each change in the a_in signal, that is, for each positive-going or negative-going edge of a_in, a separate det_a_buf pulse is generated. For a series of two or more rapid address changes, the addr_stable pulse is stretched accordingly.

Figure 3A:
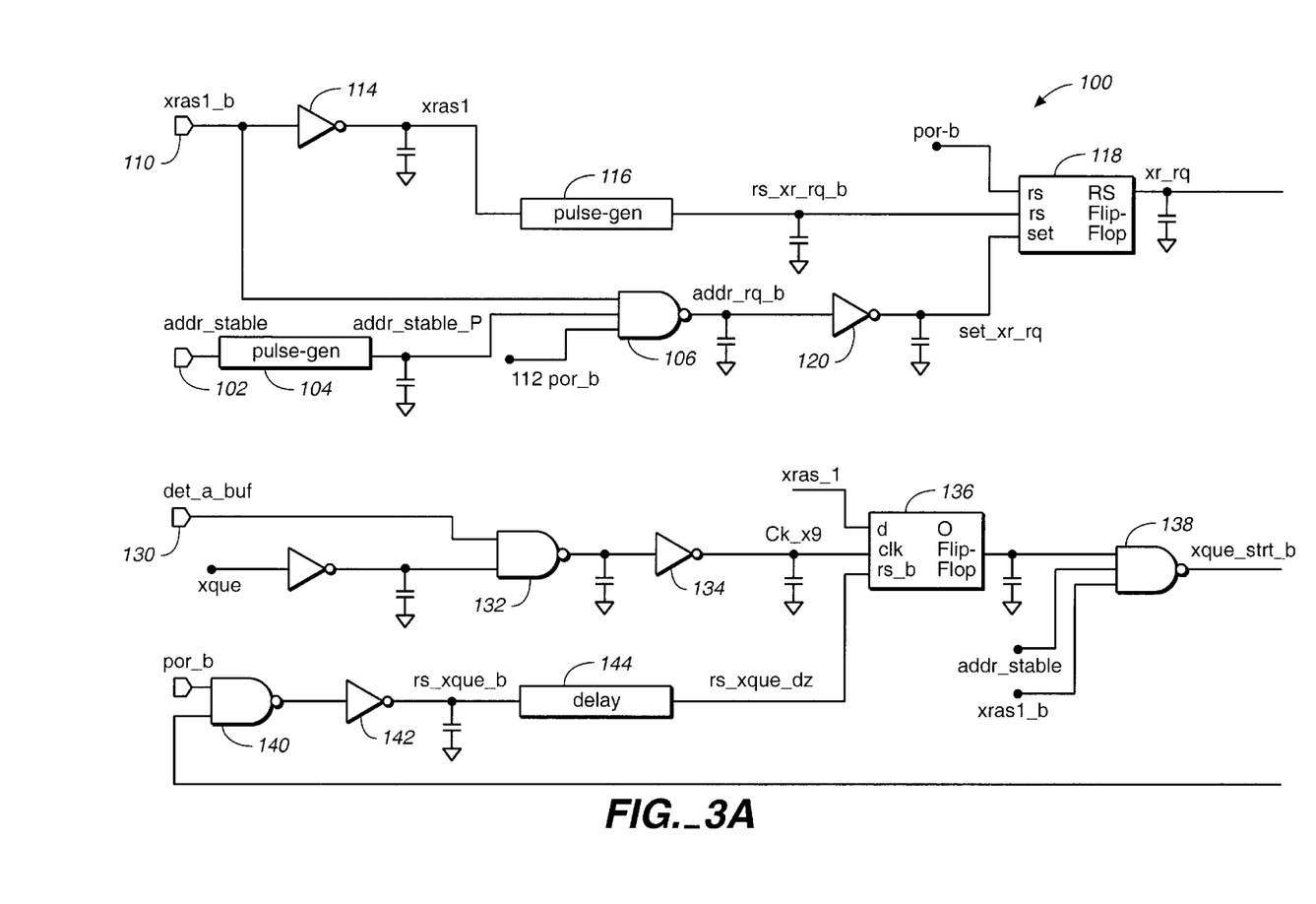
Figure 3B:
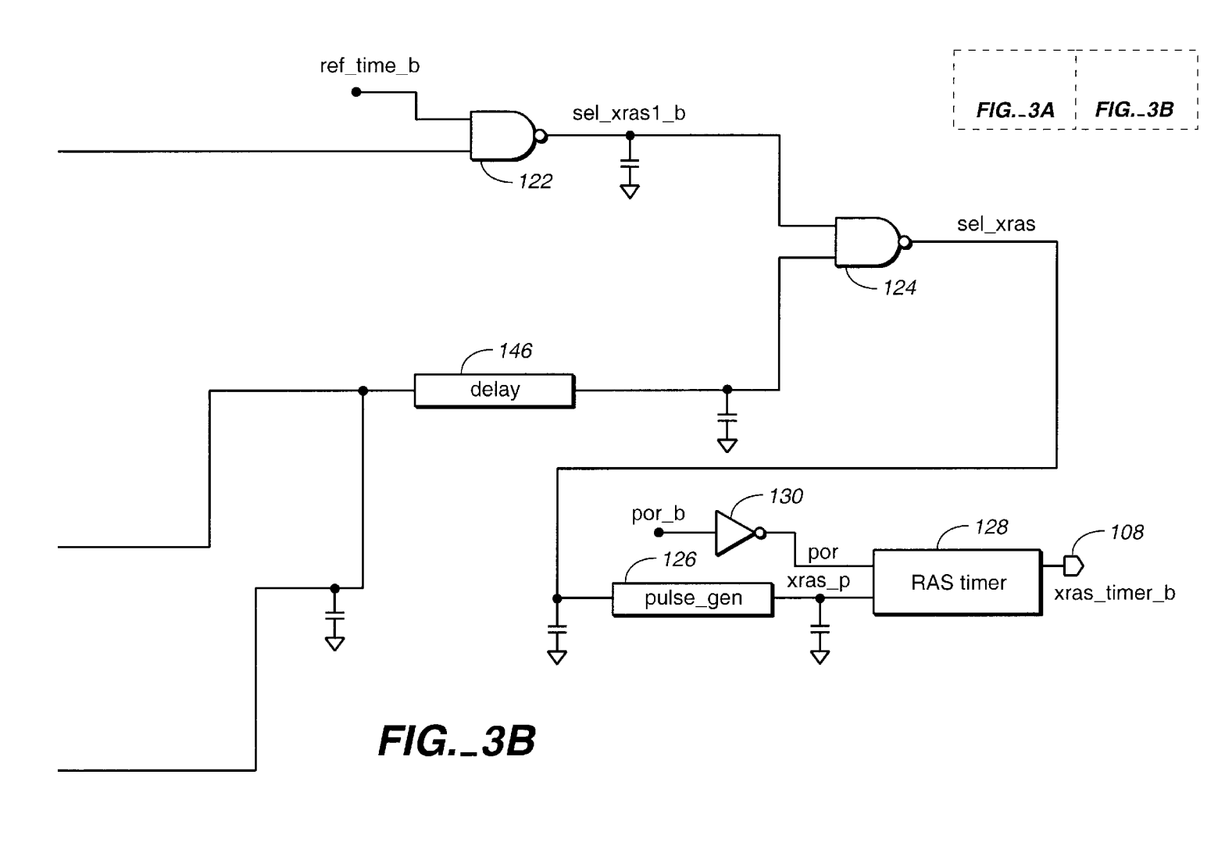

FIG. 3 is a circuit diagram of an asynchronous queuing circuit 100 for external access requests for a DRAM with an SRAM-type interface by which the DRAM cells are internally refreshed. An addr_stable signal is fed to an input terminal 102 of a pulse generator 104 that is triggered on a positive-going edge to provide an output pulse addr_stable_p to one input terminal of a 3-input NAND gate 106.

The asynchronous queuing circuit 100 has an output terminal 108 at which is provided an active LOW xras_time_b output signal. The signal xras_time_b and the signal xras1_b are effectively the same signal. The output signal xras_time_b is provided as the input signal xras1_b at an input terminal 110 that is connected to a second input terminal of the 3-input NAND gate 106. A third input terminal 112 of the 3-input NAND gate receives an inverted power-on reset por_b signal. The xras1_b signal is also passed through an inverter 114 to provide an input signal xras1 to an input terminal of another positive-edge triggered pulse generator 116 that has an output signal rs_xr_rq_b that is fed to one reset input terminal of a RS flip-flop 118. The set input terminal of the flip-flop 118 receives a set_xr_rq input signal from an output terminal of an inverter 120. An input signal addr_rq_b to the inverter is provided from the output terminal of the 3-input NAND gate 106. The 3-input NAND gate 106 and the inverter 120 form an AND gate.

An output signal xr_rq of the RS flip-flop 118 is fed to one input terminal of a 2-input NAND gate 122. The other input terminal of the 2-input NAND gate 122 receives an internal refresh control signal ref_time_b signal from the internal refresh control block 14 of FIG. 1 for the DRAM. An output sel_xras1_b signal of the 2-input NAND gate 122 is connected to one input terminal of another 2-input NAND gate 124.

An output sel_xras signal of the 2-input NAND gate 124 is fed to an input terminal of another positive-edge triggered pulse generator 126 to provide a xras_p output signal to an input terminal of a RAS timer circuit 128. The output signal of the RAS_timer 128 is the xras_time_b signal provided at terminal 108.

As soon as the xras1_b signal goes active-LOW, the xras1_b is inverted by inverter 114 to trigger the positive-edge triggered pulse generator 116 which provides a reset signal rs_xs_rq_b for the RS flip-flop 118. Consequently, shortly after a RAS cycle starts the RS flip-flop 118 is reset. As previously described, the xras_time1_b signal is fed back to the input terminal 110 as the xras1_b signal. From there it is fed to an input terminal of the 3-input NAND gate 106 and also to an input terminal of the inverter 114.

During powerup of the circuit, the RS flip-flop 118 is reset by the por_b signal and the RAS_timer 128 is reset by a por signal provided through an inverter 130.

The queuing circuit 100 for external access requests also functions to operate along with an internal refresh operation of the DRAM. During an internal refresh cycle, the ref time_b signal is provided to block transmission through the NAND gate 122 and to prevent generation of the xras_time_b output signal. When the addr_stable signal goes inactive-HIGH, the positive-edge-triggered-pulse generator 104 generates a pulse addr_stable p to set the RS flip-flop 118 so that its xr_rq output signal goes active-HIGH. When an internal refresh cycle ends, the ref time_b signal goes inactive-HIGH, so that the sel_xras1_b output signal of the 2-input AND gate 122 produces the Sel_xras output signal from the 2-input NAND gate 124 to start the RAS_timer 128 and to provide the xras_time_b signal, which executes an external access RAS cycle for the DRAM.

FIG. 3 also shows the det_a_buf signal being received at a terminal 130 that is connected to one input terminal of a 2-input NAND gate 132. An output terminal of the 2-input NAND gate 132 is fed through an inverter 134 to a clock input terminal of a D flip-flop 136 that has an output terminal with an output signal xque. The 2-input NAND gate 132 and the inverter 134 function as an AND gate. A D input terminal of the D flip-flop 136 is fed with the xras_1 signal which is the same as the xras_time_b signal. The xque output signal of the D flip-flop 136 is fed to one input terminal of a 3-input NAND gate. A second input terminal of the 3-input NAND gate 138 is fed with the adr_stable signal. A third input terminal of the 3-input NAND gate 138 is fed with the xras1_b signal. An output xque_strt_b signal at an output terminal of the 3-input NAND gate 138 is connected back to one input terminal of a 2-input NAND gate 140. The other input terminal of the 2-input NAND gate is fed with the inverted power-on reset por_b signal. An output terminal of the 2-input NAND gate 140 is connected to an input terminal of an inverter 142. The 2-input NAND gate 140 and the inverter 142 provide an AND function. An rs_xque_b output signal the AND output terminal of the inverter 142 is fed to an input terminal of a delay circuit 144. An output terminal of the delay circuit 144 is connected to an inverted reset terminal of the D flip-flop 136. The xque_strt_b output signal of the 3-input NAND gate 138 is fed to an input terminal of a delay circuit 146. An output signal of the delay circuit 146 is fed to a second input terminal of the 2-input NAND gate 124.

As shown in FIG. 2, in response to an address transition or an active edge on an input control signal (e.g. we_b or ce_b), an active-HIGH det_a_buf pulse is generated while the signal addr_stable goes active-LOW. Typically, the signal addr_stable remains active-LOW for a time longer than the time that the det_a_buf remains HIGH. The addr_stable signal can be extended to remain active-LOW if another det_a_buf pulse arrives prior to addr_stable going HIGH.

For the case where there is no current RAS cycle underway, signal xras1_b is inactive-HIGH. In this case, the addr_stable signal is activated to go active-LOW so that, when the addr_stable signal returns to an inactive-HIGH, the pulse addr stbl_p that is generated by the rising edge of addr_stable from the pulse generator 104 generates the pulse addr_rq_b, which is inverted by the inverter 120 to provide the set_xr_rq pulse signal. The set_xr_rq signal sets the RS flip-flop 118 resulting in its output signal xr_rq going HIGH. Unless there is an internal refresh cycle in progress, signal ref_time_b is inactive-HIGH. When xr_rq goes HIGH signal sel_xras goes HIGH and starts the RAS_timer 128. The RAS_timer 128 generates signal xras_time_b, which goes active-LOW and executes the RAS cycle. Signal xras1_b and xras_time_b are effectively the same signal. When the RAS access cycle begins, latch 118 is reset by signal xras1_b going LOW Inverter 114 then produces a leading positive gping edge which triggers the pulse generator 116 so that the resulting reset pulse rs_xrrq_b for the RS flip-flop 118 goes HIGH. The width of the xr_rq_pulse is relatively narrow.

Figure 4:
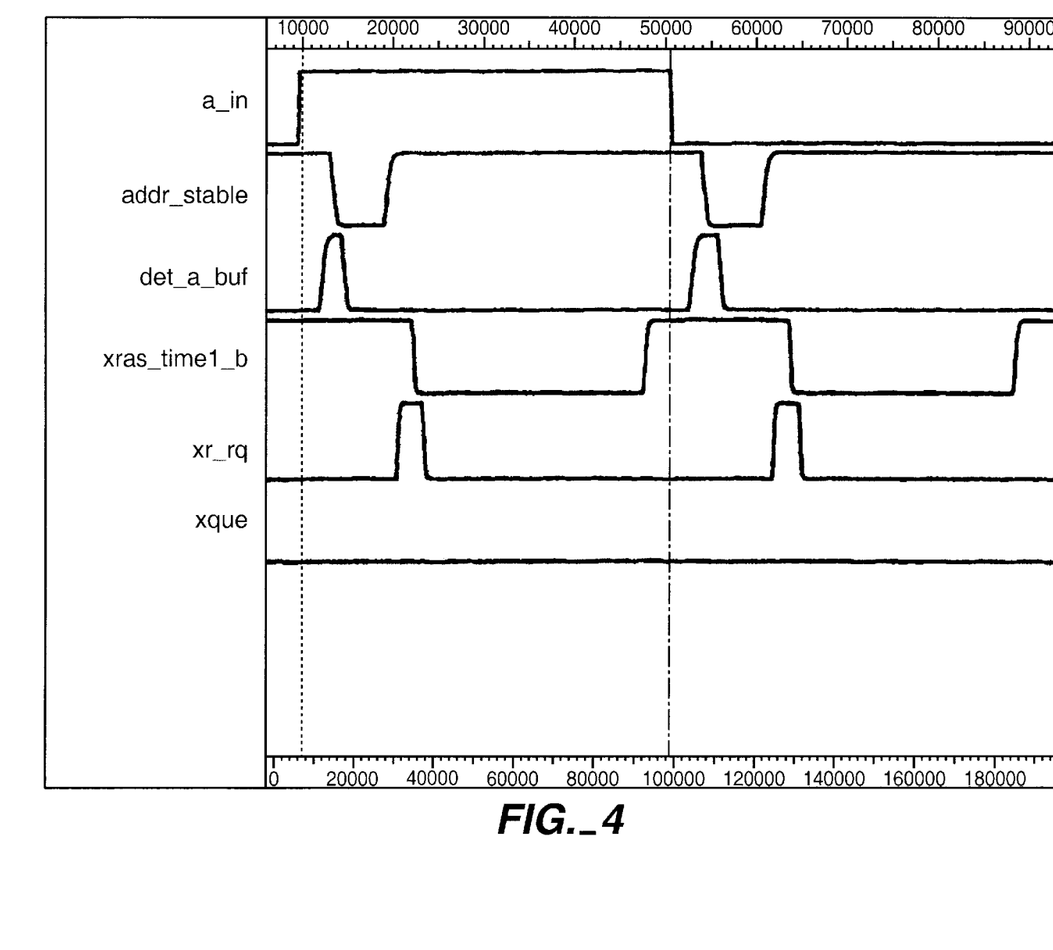
FIG. 4 is a timing diagram that illustrates a timing scenario that has a first RAS cycle being completed before a subsequent second access request is received.

FIG. 4 is a timing diagram that illustrates a timing scenario that has a first RAS cycle being completed before a subsequent second access request is received. If the RAS access cycle completes prior to the next access request, then at the next access request signal the xras_time 1_b, or the signal, xras1_b signal is inactive-HIGH and the sequence just described repeats as shown in the waveform of FIG. 4. In this case, the output signal xque of the D flip-flop is not activated.

If a RAS access cycle is currently in progress, signal xras1_b is active-LOW and signal xras1 at the D input terminal of the D flip-flop 136 is active-HIGH. A concurrent new access request generates a det_a_buf signal which clocks the xras_1 of the HIGH state into the D flip-flop 136, to thereby set the output signal of the xque D flip-flop 136 HIGH, if it is not signal D input already HIGH. If xque is already HIGH, xque still remains HIGH. When the current access cycle finishes by having the RAS timer128 times out, signal xras1_b goes inactive-HIGH, Signal addr_stable is inactive-HIGH. All 3 input signals to the NAND gate 138 are HIGH and this generates signal xque_strt_b that is asserted as active-LOW. If addr_stable is active-LOW, and xras1_b is HIGH, a new access cycle will be triggered when addr_stable goes inactive-HIGH. Signal xque_strt_b then starts the RAS_timer 128 again after some delay provided by the delay circuit 146. This delay is provided to allow sufficient precharging of the DRAM cells prior to initiation of a new RAS cycle. Signal xque_strt_b is fed back through the 2-input NAND gate 140, the inverter 142, and the delay circuit 144 to provide the rs_xque_d2 signal which resets the D flip-flop 136 so that signal xque goes inactive-LOW again. The delay provided by the delay circuit 144 ensures that signal xque is long enough to pass through the delay circuit 146 and to properly trigger the RAS_timer 128.

Figure 5:
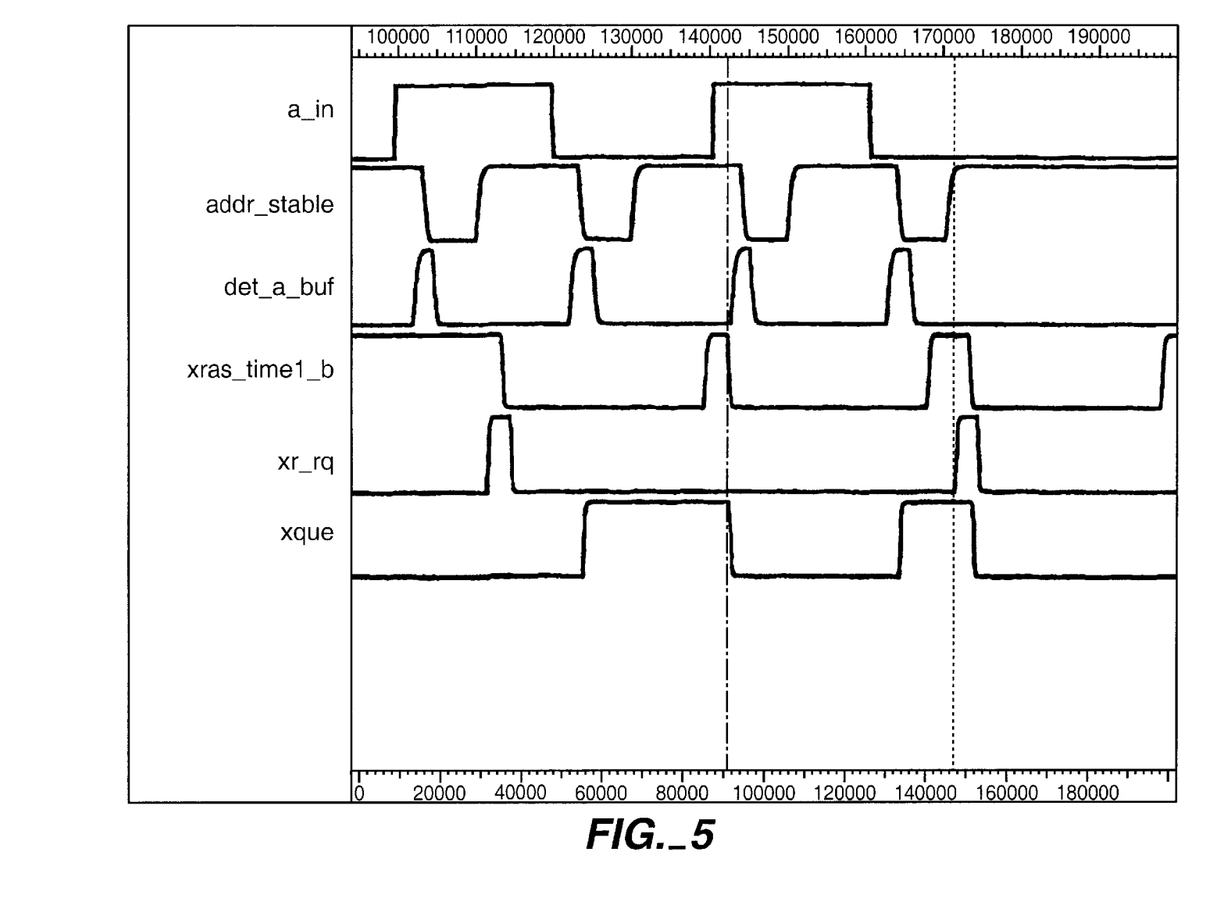
FIG. 5 is a timing diagram that illustrates a timing scenario that has a subsequent access request being received prior to completion of a previously requested RAS cycle.

FIG. 5 is a timing diagram that illustrates a timing scenario that has a subsequent access request being received prior to completion of a previously requested RAS cycle. Corresponding waveforms are shown in FIG. 5.

The first edge change of a_in produces a det_a_buf signal that triggers the D flip-flop 136 to load the LOW state of xras, to provide no change in the D flip-flop 136 output, that is to maintain a LOW xque state.

During the second edge change of a_in xras_time1_b still remains active-LOW. The input signal xras1 to the D flip-flop 136 is now HIGH so that the xque output signal of the D flip-flop 136 goes active-HIGH.

Prior to the third edge change of the a_in signal, the xras1_b signal is inactive-HIGH The addr_stable signal is inactive-HIGH, and the 4 que signal is active-HIGH. These conditions at the input to the NAND gate 138 triggers the RAS timer 128 to produce an xque_Strt_b signal, which causes active-LOW xras time1_b output signal. The xque_strt_b signal resets the D flip-flop output signal xque to LOW.

The fourth edge change of a_in causes the det_a_buf signal to get the xque signal to HIGH. The positive-going edge of the addr_stable signal triggers the RS flip-flop 118 to provide an xs_rq signal which triggers the RAS_timer 128 to provide an active-LOW xras_time1_b signal, which resets the xr_rq output signal of the RS_flip-flop 118 to LOW. The xque output signal of the D flip-flop 136 is reset LOW when xque is HIGH, addr_stable is inactive-HIGH, and xras1_b is inactive-HIGH. These waveforms also show, at the start of the last cycle, that both xr_rq and xque are reset at the start of a new cycle if they are both previously set.

Note that the RS flip-flop 118 and the D flip-flop 136 function as latches.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A circuit for queuing asynchronous external memory requests that initiate external RAS cycles of a DRAM, comprising:

an address transition circuit that, in response to changes in address input signals for the DRAM, provides an address change detection signal (det_a_buf) and, if an address input signal is stable, provides a stable address signal (addr_stable);

a RAS timer circuit that is provided with an input selection trigger signal (sel_xras) to provide a RAS output signal (xras_time1_b or xras1_b) that controls execution of external RAS cycles by the DRAM;

a first latch that, when there is no RAS cycle currently underway, is set in response to a stable address signal (addr_stable) to provide an output signal (xr_rq) that initiates an input selection trigger signal (sel_xras)for the RAS timer circuit, and that is reset whenever execution of an external RAS cycle begins;

a second queuing latch that is set in response to an address change detection signal (det_a_buf) which is received while a current RAS access cycle is underway to provide a request-queue output signal (xque) so that, when the RAS output signal goes inactive, the input selection trigger signal (sel_xras) for the RAS timer circuit is alternatively initiated;

such that when any RAS access cycle is complete and if the second queuing latch is set, a new RAS cycle is initiated and the second queuing latch is reset;

whereby any new access requests, as indicated by the address change detection signal (det_a_buf), that are received when a current RAS access cycle is underway are queued in the second queuing latch to await execution of a corresponding RAS cycle.

2. The circuit of claim 1 including
a queuing logic gate (138) that provides an active xque_start_b for initiating the input selection trigger signal (sel_xras) for the RAS timer circuit signal upon receipt of an active xque signal, an inactive addr_stable signal, and an inactive xras1_b signal, said active xque_start_b signal also resetting the second queuing latch.

3. The circuit of claim 1 wherein the first latch is an RS flip-flop circuit having an active output signal xr_rq that is set by the addr_stable signal going inactive when the xras_time1_b signal is inactive and that is reset when the xras_time1_b begins to be active.

4. The circuit of claim 1 including:

the second queuing latch is a D flip-flop circuit that has an output signal xque, that has a D input terminal for receiving the xras_1 signal$_2$ and that has a clock terminal that receives an output signal from a 2-input AND gate (132,134) that receives a det_a_buf signal from the address transition detection circuit and that receives an inverted xque signal; and a queuing logic gate (NAND gate 138) that provides an active xque_start_b signal upon receipt of an active xque signal, an inactive addr_stable signal, and an inactive xras1_b signal, said active xque_start_b signal also resetting the D flip-flop (118).

5. The circuit of claim 1 wherein the RAS output signal from the RAS timer circuit has a predetermined active time for controlling execution of an external RAS cycle by the DRAM.

6. The circuit of claim 1 including a collection NAND gate 124 that receives the active xque_start_b signal or the active output signal xr_rq to provide an active sel_xras signal from the RAS timer circuit.

7. A circuit for queuing asynchronous external memory requests for external RAS cycles of a DRAM, comprising:

an address transition detection circuit that receives an external DRAM address change input signal a_in and that provides an address detection det_a_buf output signal and an address-stable addr_stable output signal;

a RAS timer circuit that is provided with an input selection signal sel_xras that is active and that provides an output signal (xras_time1_b or xras1_b) that controls external RAS operation of the DRAM;

an RS flip-flop (first latch) having an active output signal xr_rq that is set by the addr_stable signal going inactive when the xras_time1_b signal is inactive and that is reset when the xras_time1_b begins to be active;

a RAS request queuing circuit, including:

a D flip-flop circuit 118 (second latch) that has an output signal xque, that has a D input terminal for receiving the xras1_b signals and that has a clock terminal that receives an output signal from a 2-input AND gate (132,134) that receives a det_a_buf signal from the address transition detection circuit and that receives an inverted xque signal; and a queuing logic gate (NAND gate 138) that provides an active xque_start_b signal upon receipt of an active xque signal, an inactive addr_stable signal, and an inactive xras1_b signal, said active xque_start_b signal also resetting the D flip-flop 118.

8. A method of queuing asynchronous external memory requests for external RAS cycles of a DRAM having an SRAM-type interface, comprising:

in response to any changes in address signals for the DRAM, generating a det_a_buf signal and generating an address stable signal addr_stable if the new address is stable;

if there is no RAS cycle currently underway, then using the addr_stable signal to latch a first RAS request signal in a first latch;

in response to the latched first RAS request signal, initiating a first RAS cycle;

resetting the first latch when the first RAS cycle begins;

if the first RAS cycle is currently underway, latching a subsequent, second RAS cycle request signal in a second latch using the det_a_buf signal;

when the first RAS cycle is complete and, if the second latch contains a second RAS cycle request signal, initiating a second RAS cycle for the second RAS cycle request; and resetting the second latch when the second RAS cycle begins;

then using the addr_stable signal to latch the first RAS request signal in the first latch.

9. A method of queuing asynchronous external memory requests for external RAS cycles of a DRAM having an SRAM-type interface, comprising:

if there is no RAS cycle currently underway, then setting a first request latch in response to a first external RAS request signal;

initiating a first RAS cycle in response to the first external RAS request signal;

subsequently resetting the first request latch when the first RAS cycle corresponding to the first external RAS request signal begins;

if there is a current RAS access cycle currently underway, setting a second in-progress latch in response to another external RAS request signal;

when the current RAS access cycle is completed, if the second in-process latch is set, initiating a new RAS cycle for the second external RAS request signal and resetting both the first request latch and the second in-progress latches when a RAS cycle corresponding to the second external RAS request signal begins;

whereby newly received RAS requests are queued the newly received access request signal arrives prior to completion of an access cycle already underway.

* * * * *